(12) United States Patent
Paisner et al.

(10) Patent No.: US 7,524,560 B2
(45) Date of Patent: *Apr. 28, 2009

(54) ENHANCED BORON NITRIDE COMPOSITION AND COMPOSITIONS MADE THEREWITH

(75) Inventors: Sara N. Paisner, Carrboro, NC (US); Paul Joseph Hans, Medina, OH (US); Paulo Meneghetti, Westlake, OH (US)

(73) Assignee: Momentive Performance Materials Inc., Albany, NY (US)

( * ) Notice: Subject to any disclaimer, the term of this patent is extended or adjusted under 35 U.S.C. 154(b) by 171 days.

This patent is subject to a terminal disclaimer.

(21) Appl. No.: 11/554,005

(22) Filed: Oct. 28, 2006

(65) Prior Publication Data

US 2007/0054122 A1 Mar. 8, 2007

Related U.S. Application Data

(63) Continuation-in-part of application No. 11/327,770, filed on Jan. 6, 2006, and a continuation-in-part of application No. 11/327,709, filed on Jan. 6, 2006, now abandoned, and a continuation-in-part of application No. 11/248,095, filed on Oct. 12, 2005, and a continuation-in-part of application No. 11/207,865, filed on Aug. 19, 2005.

(60) Provisional application No. 60/777,850, filed on Mar. 1, 2006.

(51) Int. Cl.
   B32B 5/66 (2006.01)
(52) U.S. Cl. .................. 428/403; 428/404; 428/405; 428/407; 427/212; 424/489; 424/657; 424/718; 525/10; 525/11; 525/12
(58) Field of Classification Search ................ 428/403, 428/404, 405, 407; 424/489, 657, 718; 525/10, 525/11, 12; 427/212
   See application file for complete search history.

(56) References Cited

U.S. PATENT DOCUMENTS

| | | | |
|---|---|---|---|
| 4,623,738 A | 11/1986 | Sugerman et al. | |
| 4,634,785 A | 1/1987 | Sugerman et al. | |
| 5,421,864 A | 6/1995 | Chiba et al. | |
| 5,665,511 A | 9/1997 | Imai et al. | |
| 5,681,883 A | 10/1997 | Hill et al. | |
| 6,160,042 A | 12/2000 | Ishida | |
| 6,162,849 A | 12/2000 | Zhuo et al. | |
| 6,645,612 B2 | 11/2003 | Pujari et al. | |
| 6,652,822 B2 | 11/2003 | Phillips et al. | |
| 6,831,031 B2 * | 12/2004 | Ishihara | 501/96.4 |
| 6,913,827 B2 | 7/2005 | George et al. | |
| 2004/0007764 A1 | 1/2004 | Jang | |
| 2004/0220419 A1 | 11/2004 | Gottschalk-Gaudig et al. | |
| 2005/0041373 A1 | 2/2005 | Pruss et al. | |
| 2005/0153124 A1 | 7/2005 | Finn et al. | |

FOREIGN PATENT DOCUMENTS

| | | |
|---|---|---|
| EP | 0198374 A | 10/1986 |
| EP | 424094 A | 4/1991 |
| EP | 0424094 A1 * | 4/1991 |
| JP | 05-051540 | 2/1993 |
| JP | 05-051557 | 3/1993 |
| JP | 05051540 | 3/1993 |
| JP | 1993051540 | 3/1993 |
| JP | 07-215705 | 8/1995 |
| JP | 07215705 | 8/1995 |
| JP | 9012771 | 1/1997 |

OTHER PUBLICATIONS

Neoalkoxy Titanate and Zirconate Coupling Agent Additives in Thermoplastics by Salvatore J. Monte. from Polymers & Polymer Composites, vol. 10, No. 2, 2002.

* cited by examiner

*Primary Examiner*—Leszek Kiliman
(74) *Attorney, Agent, or Firm*—Joseph E. Waters

(57) ABSTRACT

A boron nitride composition having its surface treated with a coating layer comprising at least one of a silane, a siloxane, a carboxylic derivative, and mixtures thereof, wherein the coating layer adheres to at least 10% of the surface of the boron nitride. The boron nitride powder surface is first treated by either a calcination process, or by coating with at least an inorganic compound for the surface to have a plurality of reactive sites containing at least a functional group that is reactive to at least one functional group of the final coating layer.

30 Claims, 5 Drawing Sheets

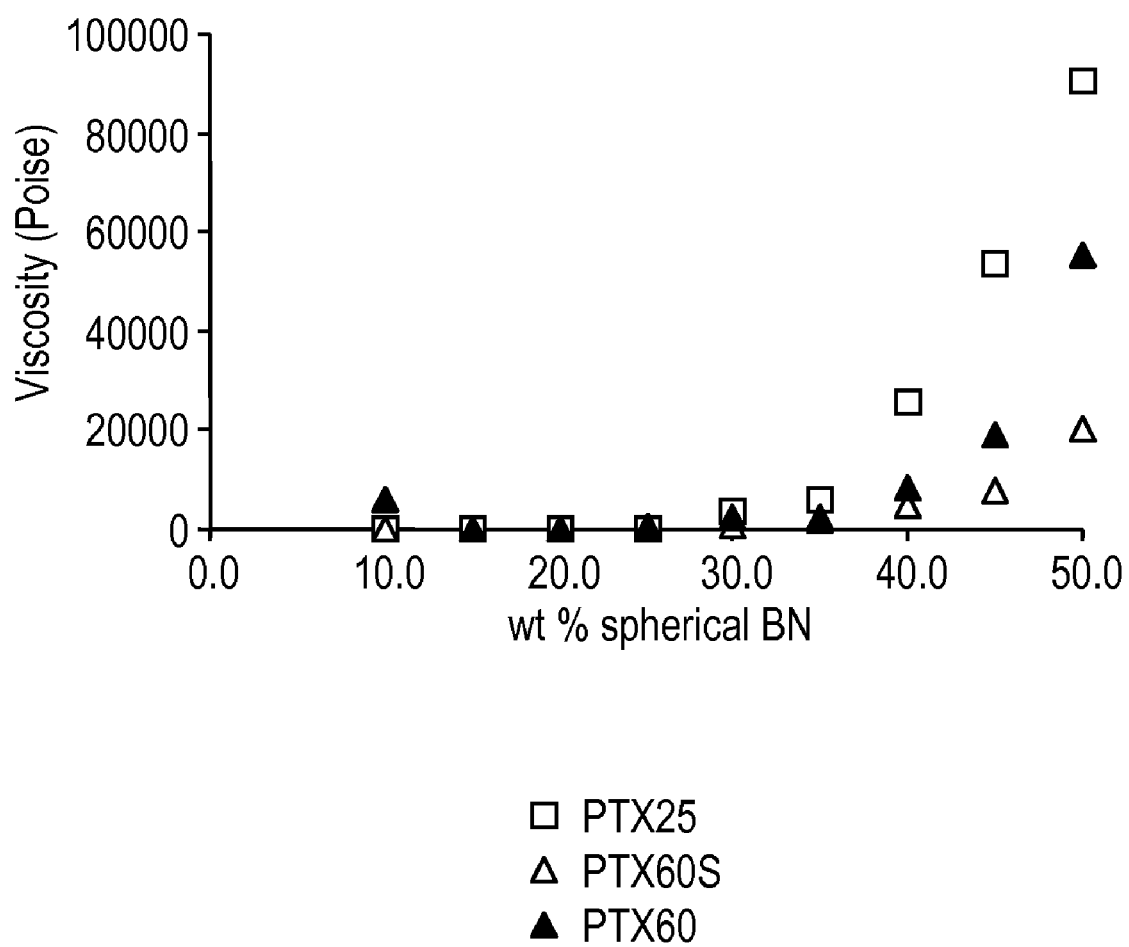

ENHANCED BORON NITRIDE COMPOSITION AND COMPOSITIONS MADE THEREWITH

CROSS-REFERENCE TO RELATED APPLICATIONS

This application claims the benefits of U.S. patent application Ser. No. 60/777,850 filed Mar. 1, 2006, which patent application is fully incorporated herein by reference. This application is also a CIP of U.S. patent application Ser. No. 11/207,865 filed Aug. 19, 2005; a CIP of U.S. patent application Ser. No. 11/248,095 filed Oct. 12, 2005; a CIP of U.S. patent application Ser. No. 11/327,709 filed Jan. 6, 2006; and a CIP of U.S. patent application Ser. No. 11/327,770 also filed on Jan. 6, 2006.

FIELD OF THE INVENTION

The present invention relates to a boron nitride composition, for use in applications including forming polymer-based compounds containing the boron nitride.

BACKGROUND OF THE INVENTION

Boron nitride ("BN") comes in a variety of crystalline structures and has a variety of uses from polishing agents to lubricants. Hexagonal boron nitride ("hBN") is a very desirable form of a white composition having hexagonal layer structure similar to graphite in platelet morphology. Because of its properties, it has found uses in heat conductivity applications, electrical insulation applications, corrosion resistance applications, lubrication applications, and as a plastic additive. Boron nitride can be molded and used in composite materials or as a raw material for cubic boron nitride. It is also used in many applications including electronic materials, non-oxidizing ceramics sintering filler powder, makeup materials, medical additives, etc.

In the prior art, BN may be manufactured in a high temperature reaction between inorganic raw materials forming a white powder composition of BN particles. When platelet BN is added as a filler to a polymer, a blended material is formed having poor Theological properties. At loaded concentrations above 30 wt. % BN, the blended material is so viscous that it is difficult to dispense from a mechanical dispenser such as a syringe. U.S. Pat. No. 6,731,088 discloses a process to manufacture BN, forming a dry powder of spherically shaped agglomerates of irregular non-spherical particles bound together by a binder and subsequently spray-dried. The spherically shaped BN agglomerates can be compounded into polymer compositions at levels of 35-50 wt. % for compositions with viscosity below about 300 cp.

JP Publication No. 05-051540 discloses BN powder treated with at least a titanate coupling agent, a silane coupling agent, and a non-inonic coupling agent in an amount of 0.1 to 5 wt. %, to improve the wettability of the BN in applications such as a release agent, a lubricant, a low-friction material, a coating material, etc. U.S. Pat. No. 6,162,849 discloses a thermally conductive moldable polymer blend having at least 60 wt. % of BN powder having an average particle size of at least 60 microns and coated with a coupling agent, and wherein the thermally conductive composition has a thermal conductivity of at least 15 W/m° K.

There is still a need for improved BN compositions, particularly for BN compositions that can be used in large quantities as a filler in applications including but not limited to automotive and electronic applications. Applicants have found a method for coating BN by first introducing reactive sites on the BN surface prior to the subsequent surface functionalizing step. The two-step coating process provides a more stable surface coating over the coating methods in the prior art, allowing the coating material to adhere to the surface of the BN as compared to some of the processes in the prior art.

BRIEF SUMMARY OF THE INVENTION

In one embodiment, the invention relates to a boron nitride powder having its surface treated with at least a coating layer comprising at least one of a silane, a siloxane, a carboxylic derivative, and mixtures thereof, wherein the coating layer adheres to at least 10% of the surface of the boron nitride, and wherein the boron nitride powder surface is first treated for the surface to have a plurality of reactive sites containing at least a functional group that is reactive to at least one functional group of the final coating layer.

The invention also relates to a boron nitride powder with its surface treated with at least a coating layer comprising at least one of a silane, a siloxane, a carboxylic derivative, and mixtures thereof, wherein the coating layer adheres to at least 10% of the surface of the boron nitride, and wherein the boron nitride powder is first treated by a calcination process. In second embodiment, the boron nitride powder is first treated by coating the boron nitride powder with an inorganic compounds selected from one of a refractory metal oxide and hydroxide.

In one embodiment, the invention relates to a two-step coating (or surface-functionalization) process, where in the first step, a plurality of reactive sites having at least a functional group are created on the BN surface; and in the second step, the BN is coated by a coating compound having at least a functional group that is reactive to at least one functional group of the reactive sites. In one embodiment, the reactive sites are introduced via a calcination process. In a second embodiment, the reactive sites are created by first coating the BN powder with at least an inorganic compound.

BRIEF DESCRIPTION OF THE DRAWING

FIG. 2 is a graph comparing viscosity in thermal greases at various loading levels of uncoated BN and an embodiment of surface-functionalized BN.

DETAILED DESCRIPTION OF THE INVENTION

Figure 1A:
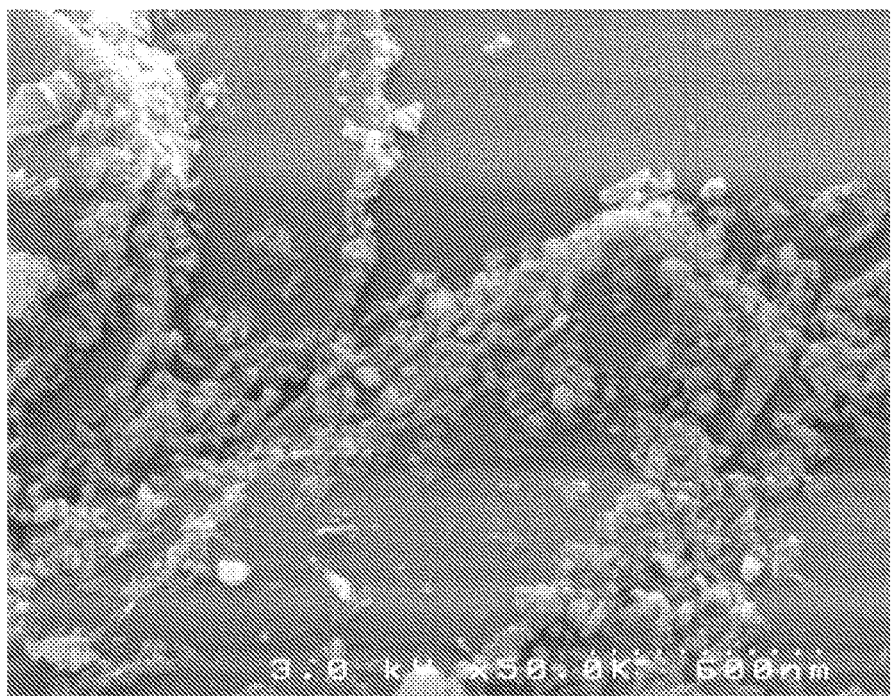
FIGS. 1A and 1B are SEM showing images of n-AlOx coated BN.

As used herein, approximating language may be applied to modify any quantitative representation that may vary without resulting in a change in the basic function to which it is related. Accordingly, a value modified by a term or terms, such as "about" and "substantially," may not to be limited to the precise value specified, in some cases.

As used herein, the term "functionalized" maybe used interchangeably with "surface functionalized," "functionalized surface," "coated," "surface treated," or "treated," referring to the coating of the boron nitride component in agglomerate form or platelet form with the coupling agent of the invention.

As used herein, the term "functionalization" or "functionalized" relates to modification of the BN surface to provide a plurality of functional groups on the BN surface. A "functionalized surface" as used herein refers to the coating that has been modified so that a plurality of functional groups are covalently attached thereto, either directly or indirectly.

In one embodiment, a BN composition of the invention has its surface functionalized by the use of at least a coupling agent to modify the surface properties of the particle, thus subsequently enhance the wetting of a polymer matrix and/or allow grafting of a polymer matrix onto the BN particle surface. In another embodiment of a BN composition, a plurality of reactive sites having at least a functional group are introduced to the BN surface, for subsequent reactions with the coupling agent having at least a functional group that is reactive to the reactive sites on the BN surface.

Boron Nitride Component. As the starting material, the uncoated BN component comprises crystalline or partially crystalline boron nitride particles made by processes known in the art. These include spherical BN particles in the micron size range produced in a process utilizing a plasma gas as disclosed in U.S. Pat. No. 6,652,822; hBN powder comprising spherical boron nitride agglomerates are formed of irregular non-spherical BN particles bound together by a binder and subsequently spray-dried, as disclosed in U.S. Patent Publication No. US20010021740; BN powder produced from a pressing process as disclosed in U.S. Pat. Nos. 5,898,009 and 6,048,511; BN agglomerated powder as disclosed in U.S. Patent Publication No. 20050041373; BN powder having high thermal diffusivity as disclosed in U.S. Patent Publication No. US20040208812A1; and highly delaminated BN powder as disclosed in U.S. Pat. No. 6,951, 583.

In one embodiment, the BN powder comprises platelets having an average particle size of at least 50 μm. In another embodiment, the BN powder has an average particle size of 5 to 500 μm. In a third embodiment, from 10 to 100 μm. In a fourth embodiment, from 10 to 50 μm. In one embodiment, the BN powder comprises irregularly shaped agglomerates of hBN platelets, having an average particle size of above 10 μm.

In another embodiment, the BN powder is in the form of spherical agglomerates of hBN platelets. In one embodiment of spherical BN powder, the agglomerates have an average agglomerate size distribution (ASD) or diameter from 10 to 500 microns. In another embodiment, the BN powder is in the form of spherical agglomerates having an ASD in the range of 30 to 125 microns. In one embodiment, the ASD is 74 to 100 microns. In another embodiment, 10 to 40 microns.

In one embodiment, the BN powder is in the form of platelets having an average size of at least about 1 micron, and typically between about 1 and 20 μm, and a thickness of no more than about 50 μm. In another embodiment, the powder is in the form of platelets having an average aspect ratio of from about 50 to about 300.

In one embodiment, the BN is an h-BN powder having a highly ordered hexagonal structure with a crystallization index of at least 0.12. In another embodiment, the BN powder has a crystallinity of about 0.20 to about 0.55, and in yet another embodiment, from about 0.30 to about 0.55.

In one embodiment, 10 to 40 vol. % of the BN powder display an average particle size of about 5 to 25 microns; about 60 to 90 vol. % of the particles display an average particle size of about 40 to 80 microns. The powder is found suitable for applications wherein the BN powder is used as fillers in polymer composites, e.g., microprocessor packaging requiring high thermal conductivity properties.

In one embodiment and prior to being functionalized or mixed into a polymer composite, the BN powder is dried in a forced air oven for about 300° F. for at least 6 hrs. and then kept at 120° F. before being treated or before mixing.

In one embodiment and prior to being functionalized or mixed into a polymer composite, the BN is sintered at a temperature of at least 1800° C. for about 1 to 4 hrs. Suitable atmospheres for sintering include inert gas, nitrogen, and argon. In one embodiment, the sintering is in a vacuum.

In another embodiment, the hBN particles are first washed in 2% glacial acetic acid de-ionized water solution to remove possible residual surface contaminants from powder processing, in an amount of 5-10 wt. % BN solid in water solution. The solution is stirred at 80-100° C. for a few hours then vacuum filtered. The BN particles may then be washed again with fresh deionized water before being dried in air circulating oven at 110° C. prior to the next step of being functionalized/coated with the coupling agent.

Increasing the Reactive Sites: In one embodiment, uncoated BN powder particles are calcined at a sufficiently high temperature for a sufficient period of time for to increase the oxygen concentration in the BN by at least 100%. In one embodiment, the BN powder particles are calcined for a sufficient period of time for the oxygen concentration to be at least 1 wt. %. In another embodiment, the BN powder particles are calcined for a sufficient of time and at a sufficient temperature for the BN oxygen concentration to be at least 3 wt. %.

In one embodiment, the calcination of spherical BN powder is as graphically illustrated below to increase the surface oxidation, with the modification allowing for increased reactive sites on the BN surface for further functionalization with organic materials:

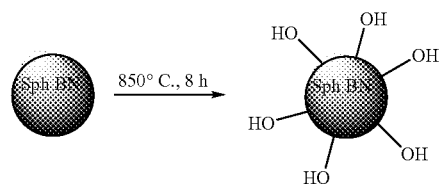

In a second embodiment, in addition to or in place of a calcination step to oxidize the surface layer of BN particles to create reactive sites, the BN particles are first coated with an inorganic or organometallic compound having a functional group that is reactive to at least one functional group of the final coating layer. In one embodiment, the BN powder is coated with at least a refractory metal oxide or hydroxide. Examples include alumina, silica, zirconia, boria, titania, titanium dioxide, ceria, germania, tantalum oxide, cesium oxide, yttrium oxide, colloidal yttria, magnesia, thoria, phosphate, and mixtures thereof, in an amount ranging from 0.5 to about 10 wt. % of the inorganic compound as the oxidizing agent. In one embodiment, the BN is coated with about 1 to about 5 wt. % of the inorganic compound.

In one embodiment, the 1st coating material is selected from the group of metal acetates, metal nitrates, metal sulfates, and mixtures thereof. In some embodiments, these materials decompose upon heat-treatment forming oxides and thus creating reactive sites. Examples include calcium acetate, calcium sulfate, or calcium nitrate, sodium acetate, sodium sulfate, sodium nitrate, magnesium acetate, magnesium sulfate, magnesium nitrate, nickel acetate, nickel sulfate, nickel nitrate, copper acetate, copper sulfate, copper nitrate, zinc acetate, zinc sulfate, zinc nitrate, strontium acetate, strontium sulfate, strontium nitrate, yttrium acetate, yttrium sulfate, yttrium nitrate, zirconium acetate, zirconium sulfate, zirconium nitrate, hafnium sulphate, hafnium nitrate, titanium sulfate, molybdenum acetate, molybdenum sulfate, vanadium acetate, vanadium sulfate, vanadium nitrate, chromium acetate, chromium sulfate, chromium nitrate, manganese acetate, manganese sulfate, manganese nitrate, ferrous acetate, ferrous sulfate, ferrous nitrate, cobalt acetate, cobalt sulfate, cobalt nitrate, cadmium acetate, cadmium sulfate, cadmium nitrate, silver acetate, silver sulfate, silver nitrate, palladium acetate, palladium sulfate, palladium nitrate, rhodium acetate, rhodium sulfate, rhodium nitrate, colloidal silica and the like, upon heat treatment, decomposes into the corresponding metal oxide forming a coating layer on the BN surface with reactive sites.

In one embodiment, the 1st coating material is selected from at least one of aluminum sulfate, aluminum propoxide, aluminum silicate, sodium aluminate, aluminum acetate, and the like, which decompose in the sintering step downstream of the process to form alpha aluminum oxide, coating the BN surface with composites of boron nitride/aluminum oxide with increased number of reactive sites.

In yet another embodiment, the 1st coating material is selected from the group of calcium acetate, calcium sulfate, and calcium nitrate, for decomposition forming a coating of calcium oxide with increased number of reactive sites on the BN surface. In one embodiment, sodium acetate, sodium sulfate, or sodium nitrate is used, for a coating of sodium oxide. In a third embodiment, magnesium acetate, magnesium sulfate, or magnesium nitrate is used, thus gives magnesium oxide as a coating material with reactive sites. In a fourth embodiment, a coating material of nickel acetate, nickel sulfate, or nickel nitrate is used for a nickel oxide coating. In a fifth embodiment, a copper acetate, copper sulfate, or copper nitrate is used as the 1st coating material, for the formation of a copper oxide coating. In a sixth embodiment, a zinc acetate, zinc sulfate, or zinc nitrate is used as the binder material, for zinc oxide to be formed as a coating material with reactive sites on the BN surface. In a seventh embodiment, the 1st coating material is selected from the group of strontium acetate, strontium sulfate, strontium nitrate, for strontium oxide to be formed as a coating layer having reactive sites.

In one embodiment, the 1st coating material comprises colloidal silica having containing suspensions of independent (or non-agglomerated) nanoparticles of silica ($SiO_2$) in water with sizes ranging from 10 to 100 nm. In a second embodiment, the BN particles are wet coated with a colloidal silica binder having silica particles with average particle sizes ranging from 20 to 50 nm.

Suitable phosphate compounds for use as the first oxidizing coating layer include water soluble phosphate compounds, such as for example, tetrapotassium pyrophosphate, sodium polyphosphate, tetrasodium pyrophosphate, sodium tripolyphosphate, potassium tripolyphosphate, sodium hexametaphosphate, phosphoric acid, and the like. In one embodiment, the water-soluble phosphate compound is sodium hexametaphosphate.

Suitable zirconia compounds for use as the first oxidizing coating layer include any water-soluble zirconia compound capable of providing zirconia for deposition upon the BN particles can be used. Examples include acidic salts such as zirconium oxychloride, zirconyl sulfate, and the like. In one embodiment, the zirconia compound is zirconium oxychloride or zirconyl sulfate, or mixtures thereof.

Suitable titania compounds for use as the first oxidizing coating layer include titania hydrate, monoclinic titania, anatase and rutile, and mixtures thereof. Suitable alumina compounds for use as the first oxidizing coating layer include aluminates, such as for example, sodium or potassium aluminate, aluminum sulfate, aluminum chloride, and the like. In one embodiment, the water-soluble alumina compound is sodium aluminate. In another embodiment, a water-soluble alumina compound such as aluminum acetate is used as graphically illustrated below to form alumina coating with increased reactive sites on the BN surface for further functionalization with organic materials:

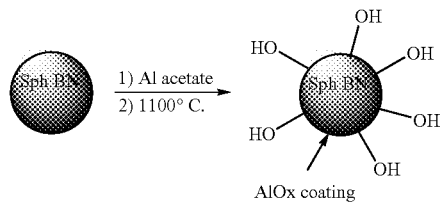

AlOx coating

In one embodiment, the BN composition having increased number of reactive sites on the surface is next coated with a compound having at least one functional group that is reactive to the reactive sites on the BN surface, wherein the coating compound is adhered to at least a portion of the surface of the BN through one or more of covalent bonds, one or more of electrostatic bonds (e.g., one or more ionic bonds), one or more hydrogen bonds, one or more Van der Waals bonds, or combinations thereof As used herein, "coupling agent" may be used interchangeably with "coating compound," "over coating composition," or "coating composition." The coating compound is selected based on the polymer matrix to be used in the final application of the intended composition as well as the intended final application composition, e.g., thermal management for the electronics industry, tire applications for the automotive industry, etc.

As opposed to a number of coating methods in the prior art, the over-coating material adheres to any suitable amount of the surface of the BN particles in the method of the invention. In one embodiment, the coating compound adheres to at least about 2% of the surface of the BN particles. In a second embodiment, at least 5% of the surface of BN particles. In a third embodiment, the coating compound adheres to at least 7% of the surface. In a fourth embodiment, at least 10% of the surface. Examples of coating compounds include aliphatic, amino-, and fluorinated-silanes, siloxanes, and aliphatic and aryl carboxylic acids. In one embodiment, a monolayer of coating compound is achieved on the surface of the BN particles. In another embodiment, the BN particles are coated with a plurality of coating layers for the surface to be mostly, if fully 100% coated.

In one embodiment, the coating compound is a carboxylic derivative such as methanoic acid and benzoic acid. In one embodiment, the coating compound is one of a polyparahydroxy benzoic acid and undecyloxybenzoic acid.

In one embodiment, the coating is a silane, and the silane compound is adhered to a portion of the surface of the BN particle through one or more covalent bonds. In one embodiment, the silane compound is selected from the group consisting of functionalized silanes, disilanes, trisilanes, oligomeric silanes, polymeric silanes, and combinations thereof. In a second embodiment, the silane compound comprises at least one functional group selected from the group consisting of amine group, carboxylic acid group, anhydride group, phosphonic acid group, pyridinyl group, hydroxyl groups, epoxy groups, thioisocyanate group, blocked polythioisocyanate group, amide group, carbamate group, maleimide group, fumarate group, onium salt group, hydroxy alkylamide group, and half-ester acid group and salts thereof In a third embodiment, the silane compound comprises at least one amine group. In a fourth embodiment, the silane compound is epoxy silane.

In one embodiment, the silane compound has the formula $R_nSiX_{4-n}$, wherein n=between 0 and 2 and R stands for a substituted or unsubstituted organic residue, and X stands for functional groups and/or for substituted or unsubstituted organic residues which form complexes with hydroxyl groups and/or react with hydroxyl groups forming a covalent bond and/or are displaced out of the organosilane by hydroxyl groups with the formation of an oxygen-silicon bond. Exemplary silane compounds include, but are not limited to, ethylsilane, diethylsilane, triethylsilane, phenylsilane, diphenylsilane, triphenylsilane, n-hexylsilane, poly(methylhydrogen) siloxane, and mixtures thereof. In one embodiment, the silane compounds are selected from the group of diethylsilane, phenylsilane, n-hexylsilane, and mixtures thereof.

In one embodiment, the coating compound is one of a silicone carboxy compound such as Dimethicone PEG-7 phtalate (Ultrasil™ CA-1), dimethicone PEG-7 succinate (Ultrasil™ CA-2), an (aminopropylmethylsiloxane)-(dimethylsiloane) copolymer, 3-glycidoxypropyl trimethoxysilane, a (3,3,3-trifluoropropyl)trimethoxysilane, N-(2-aminoethyl)-3-aminopropyl trimethoxysilane, (MeO)3SiPh, and undecyloxybenzoic acid. In another embodiment, the coating compound is a silicone fluid in the form of straight chains of polydimethylsiloxane (PDMS), which are terminated with a trimethylsilyl group (or groups).

In one embodiment wherein silica is used as the oxidizing agent and wherein the surface-functionalized BN is to be used in an elastomeric polymer matrix, a sulfane coating compound, such as bis (3-triethoxysilylpropyl) tetra-sulfane, commercially available as Si-69 from Degussa AG, Germany, may be used as the coupling agent/coating layer. Si-60 creates a chemical linkage between the elastomer and the silica, thereby coupling the silica to the elastomer.

In one embodiment, additives including initiators, dispersants, defoaming agents, and adhesion promoters may be optionally added to the coating compound. Initiator examples include thermal initiators, chemical initiators, electron beam initiators, and photoinitiators.

Method for Preparing the BN Composition There are various embodiment of a first step to increase the reactive sites on the BN surface, including a dry method and a wet method.

In one embodiment of a dry method, the BN particles are calcined at a temperature between 200 to 1100° C. In a second embodiment, at a temperature between 300 to 900° C. In a third embodiment, at a temperature between 500 to 900° C. In one embodiment, the BN particles are calcined for a sufficient amount of time and at a sufficient temperature for an oxygen concentration of at least 2%. In a second embodiment, the BN particles are calcined for about 1 to 5 hours to oxidize the surface layer of BN particles for an oxygen concentration of at least 3 wt. %. As means of calcination with heating, a variety of means such as electric furnace, gas furnace, rotary kiln and continuous furnace can be employed in so far as an oxidizing environment (e.g., air) is ensured.

In a second embodiment of a dry method, the oxidation via calcination is carried out with uncoated BN powder. In one process, uncoated BN product is sintered at a temperature of at least about 1600° C. for about 1 to 12 hours to improve the thermal diffusivity, impurity, and crystal structure of the BN. The sintering is typically in the range of 1800° C. to 2400° C. for a few hours in atmospheres including inert gas, nitrogen, and argon. Once the firing (sintering) is complete, the BN product is typically cooled in the furnace where the sintering takes place. In the (oxidizing) auxiliary step to a sintering process, as the temperature of the BN powder reaches the desired calcination temperature, e.g., in the range of 200 to 1100° C., the temperature is maintained at the calcination temperature and under an oxidation environment such as air. In one embodiment, when the BN temperature reaches 850° C., air is purged through the apparatus (tray, furnace, capsule) containing the BN instead of purging with $N_2$ as with a typical sintering process.

Another embodiment of a "dry" method is mixing, wherein the refractory metal oxide or hydroxide coupling agent is mixed directly with the BN to be treated using a mixer or the like. Other dry methods including tumbling, prilling (also known as perforated pan coating), among others. After dry mixing, the coated BN can be calcined for a sufficient period of time at a sufficient temperature to further increase the reactive sites on the BN surface.

In one embodiment of a "wet" method to increase the reactive sites, the coating compound (i.e., coupling agent) is selected from refractory metal oxides, metal hydroxides, or compounds thereof, e.g., aluminum sulfate, aluminum propoxide, aluminum silicate, sodium aluminate, or aluminum acetate, etc., the BN powder, and optional materials are treated in a solvent and the solvent is subsequently removed. In yet another embodiment of a wet method to increase the reactive sites, the coating compound is selected from the group consisting of sorbitan monostearate, sorbitan monolaurate, sorbitan monoleate, sorbitan monopalmate, polyoxyethylene sorbitan monolaurate, polyoxyethylene sorbitan monostearate, polyoxyethylene sorbitan monooleate, polyoxyethylene sorbitan monopalmate, and polyoxyethylene sorbitan tristearate, and mixtures thereof.

Other wet methods include spray coating and washing. The solvent can be organic solvents and water. Examples of organic solvents include aromatic solvents such as toluene, xylene, and the like; hydrocarbon solvents such as hexane, octane, and the like; esters such as ethyl acetate, butyl acetate, and the like; and ethers such as ethyl ether and the like. In one embodiment, the solvent is used in an amount of 30-3000 parts by weight based on 100 parts by weight of the coupling agent.

In one embodiment of a "wet method" to increase the reactive sites, silica is used as a $1^{st}$ coating layer to increase the reactive sites. First, an aqueous media (e.g., water) and boron nitride are brought into contact with a solution containing at least a silicate, wherein the silicate is substantially free of metal ions. The contact is for a sufficient time and at a sufficient temperature to form a silica-coated boron nitride composition. The aqueous media containing boron nitride may be in the form of an aqueous slurry, in one embodiment, containing from 1% to about 20 wt. % BN. The aqueous media and BN can be separately added or brought into contact with the solution containing the silicate. Besides BN, optional ingredients can be present in the aqueous slurry such as dispersants, surfactants, stabilizers, and buffering agents. The various optional ingredients can be present in conventional amounts and a surfactant may assist in making the BN more dispersible in the aqueous media for purposes of obtaining a uniform coating of silica on the BN.

In one embodiment, the temperature of the aqueous media/slurry can be any temperature which permits silica to form and coat onto the BN, e.g., in one embodiment, of at least 70° C. In a second embodiment, the media or slurry has a pH of from about 4 to about 10, and more preferably from about 4 to about 7. The pH of the aqueous media or slurry can be adjusted to any desired pH with the use of a base or acid as is known to those skilled in the art. Preferably, an acid or base free of metal components is used for controlling pH, such as ammonia-based compounds. The silicate which is substantially free of metal ions generally has less than about 750 ppm metal ions, and in one embodiment, negligible or no metal ions present. In one embodiment, the silicate is a silicic acid which may also include ionic silicon-containing species such as $HSiO_3^-$ and $SiO_3^{2-}$. Other forms of silicon-containing species can also be present, e.g., monosilicic acid.

In another embodiment of a wet method to increase the reactive sites, and using water as a solvent, the BN particles are treated with a mixture of a cycolo[dineopentyl(diallyl)] pyrophosphate dineopentyl(diallyl) zirconate and a surfactant such as sodium dodecylbenzene-sulfonate, ethoxylated nonyl phenol or cetyl trimethyl ammonium chloride.

In one embodiment after a dry or wet coating method, the BN particles are optionally calcined at a temperature between 200 to 1100° C. to further increase the number of reactive sites on the BN surface prior to surface functionalization. In one embodiment, the BN particles after being treated/coated with an organometallic compound, the coated material is heated to a sufficient temperature, i.e., a temperature that is high enough for the organometallic compound to break down, forming the corresponding metallic oxide, e.g., alumina, silica, zirconia, boria, titania, ceria, germania, tantalum oxide, cesia, yttria, magnesia, thoria, and mixtures thereof.

After the number of reactive sites on the BN particles are increased by either a dry or wet method to oxidize the BN surface or introduce reactive sites onto the surface of the BN particles, the BN particles are surface functionalized with a coating compound. In one embodiment, surface functionalization is carried out by treating a mixture of the coating compound and BN particles with increased reactive sites in a solvent and the solvent is subsequently removed. The solvent can be organic solvents and water. Other surface functionalization methods include spray coating and washing. Examples of organic solvents include aromatic solvents such as toluene, xylene, and the like; hydrocarbon solvents such as hexane, octane, and the like; esters such as ethyl acetate, butyl acetate, and the like; and ethers such as ethyl ether and the like. In one embodiment, the solvent is used in an amount of 30-3000 parts by weight based on 100 parts by weight of the coupling agent.

In one embodiment, surface functionalization is done by refluxing the coating compound and the BN particles in a 4:3 methoxypropanol: DI water solution at a sufficient temperature for a sufficient amount of time for the reaction to take place between the reactive sites and the coating compound. In a second embodiment, the surface functionalization with organic reagents takes place in refluxing water and methoxyisopropanol (MeOIPA) blends.

In one embodiment, the coating compound adheres to at least about 10% of the surface of the BN particles. In a second embodiment, the refluxing is carried out for a sufficient amount of time for at least 15% of the surface of BN particles to be surface functionalized. In a third embodiment, at least 30% of the surface of BN particles is surface functionalized. By using TGA, the amount of organic reagent that actually coated the surface could be approximated.

Compounds Containing Surface Functionalized BN: The surfaced-functionalized BN may be used in a powder form, or incorporate into a paste form of about 60 to 80 wt. % of solid BN in an aqueous or non-aqueous medium of IPA, methanol, ethanol and the like.

In polymeric compounds, the surfaced-functionalized BN in powder or paste form is used in amounts of 30 to 80 wt. % of BN to total weight of the compounds, along with a polymeric matrix component such as a polyester, a melt-processable polymer, a phenolic, a silicone polymer (e.g., a silicone rubber), an acrylic, a wax, a thermoplastic polymer, a low molecular weight fluid, or an epoxy molding compound, for a thermal conductivity of about 1 W/mK to about 25 W/mK. In one embodiment, the surfaced-functionalized BN is used as a filler in levels of up to 90% for increasing thermal conductivity of up to 37.5 W/mK or higher.

In one embodiment, the polymeric matrix comprises an elastomer. Such elastomers include, but are not limited to, homo- or co-polymers of 1,3 butadiene, styrene, isoprene, isobutylene, 2,3-dimethyl-1,3-butadiene, acrylonitrile, ethylene, and propylene. Examples include styrene-butadiene rubber (SBR), natural rubber and its derivatives such as chlorinated rubber, polybutadiene, polyisoprene, oil-extended derivatives; polymers and copolymers of conjugated dienes such as polybutadiene, polyisoprene, polychloroprene, and the like, and copolymers of such conjugated dienes with an ethylenic group-containing monomer copolymerizable therewith such as styrene, methyl styrene, chlorostyrene, acrylonitrile, 2-vinyl-pyridine, 5-methyl 2-vinylpyridine, 5-ethyl-2-vinylpyridine, 2-methyl-5-vinylpyridine, alkyl-substituted acrylates, vinyl ketone, methyl isopropenyl ketone, methyl vinyl either, alphamethylene carboxylic acids and the esters and amides thereof such as acrylic acid and dialkylacrylic acid amide; copolymers of ethylene and other high alpha olefins such as propylene, butene-1 and pentene-1; polymers (e.g., homopolymers, copolymers, and terpolymers) manufactured from 1,3 butadiene, styrene, isoprene, isobutylene, 2,3-dimethyl-1,3 butadiene, acrylonitrile, ethylene, propylene, and the like; vulcanized compositions (VR), thermoplastic vulcanizates (TPV), thermoplastic elastomers (TPE) and thermoplastic polyolefins (TPO). Blends of any of the foregoing may also be used. The elastomeric compositions may include one or more curing agents such as, for example, sulfur, sulfur donors, activators, accelerators, peroxides, and other systems used to effect vulcanization of the elastomer composition.

In tire applications, the resultant elastomeric compounds containing the BN composition may optionally containing one or more coupling agents such as a tread compound, under-tread compound, sidewall compound, wire skim compound, inner-liner compound, bead, apex, any compound used in components for vehicle tires, industrial rubber products, seals, timing belts, power transmission belting, and other rubber goods.

In one embodiment, the thermoplastic polymer matrix comprises at least one of a liquid crystal polymer; a polyester such as polyethylene naphthalate, polyethylene terephthalate, polybutylene terephthalate; a polyamide; a polyphthalamide; a polyimide; a polyphenylene sulfide; a polycarbonate; a polyetheretherketone; a polyaryletherketone; a polyarylene sulfide; a polyphenylene oxide; and a mixture thereof.

The polymeric compound containing surfaced-functionalized BN may be prepared by techniques known in the art, such as melt-mixing in equipment such as a mill, a Banbury, a Brabender, a single or twin screw extruder, continuous mixers, kneaders, etc.

Applications and Articles Employing Surface Functionalized BN: In one embodiment, the surface-functionalized BN of the invention allows the loading concentration of BN to be raised with little increases in the viscosity of the composite, relative to the same composite loaded with untreated BN; thereby providing enhanced thermal conductivity and lower viscosity or simply to reduce the viscosity of the filled polymer composite to enhance its processability. In one embodiment, the surface-treated BN composition when blended into a polymer composite, lowers the viscosity of the polymeric composite at least 20% over the viscosity of the polymeric composition containing the same amount of boron nitride powder not treated with the zirconate-coupling agent. In another embodiment, the viscosity is lowered at least 50%, particularly when the surface-treated BN is added in an amount of greater than 20 wt. % (based on the total weight of the polymer composite with BN filler)

Polymer composites comprising the BN powder functionalized with the zirconate coupling agent of the invention may be used for applications such as articles, sheets, films, parts, for use in microprocessor packaging, automotive parts and components, tires, bearing housings, heat-exchanger applications such as heat sinks for microprocessors and integrated circuit chips, plastic ball grid array packages, quad flat packs, and other common surface-mounted integrated circuit packages, etc., particularly applications demanding a high thermal conductivity which is close to that of pure alumina (about 25 W/m° K).

EXAMPLES

Examples are provided herein to illustrate the invention but are not intended to limit the scope of the invention.

In the examples, BN powder is commercially available from General Electric Company, Quartz business located in Cleveland, Ohio, as PTX60 (spherical agglomerates of hexagonal platelet BN with an average particle size of 60 microns); PT120 (hexagonal platelet BN having an average particle size of 12 microns); and PT110 (hexagonal platelet BN having an average particle size of 45 microns). Starting BN powder has an oxygen level of less than 0.4%, as indicative of available reactive sites on the BN surface.

Example 1

In this example, BN particles are surface-functionalized in an one-step process with a wax type material, Sorbitan (Liposorb-S), to increase the number of reactive sites on the BN surface. The coating is applied by blending the BN powder (PTX60 or PTX25) with 3 wt. % sorbitan for 15 minutes in a V-blender (forming PTX60S or PTX25S). During the V-blending, the D50 of PTX60 is reduced from 60 micron to 45 micron since the shear from blending causes the spheres to break and diminish in average size. The carbon and oxygen content increases significantly with the coating, as well as the tap density.

FIG. 2 illustrates the change in viscosity of coated vs. uncoated BN particles with the coating layer helps reduce the viscosity. Tables 1 and 2 show values obtained from coated BN powder (with increased reactive sites) vs. uncoated BN powder.

TABLE 1

|  | PTX60S | PTX25S |
|---|---|---|
| Oxygen (%) | 1.392 | 1.42 |
| Carbon (%) | 1.881 | 1.87 |
| SA (m2/g) | — | — |
| Sol. Borate (%) | 0.05 | 0.06 |
| D10 (microns) | 11.64 | 9.50 |
| D50 (microns) | 43.91 | 22.92 |
| D90 (microns) | 77.47 | 41.98 |
| Tap Density (g/cc) | 0.54 | 0.41 |
| Thermal Cond. (W/mK) at 40 vol % BN | 12.23 | 12.16 |

TABLE 2

| Particle | Mean Particle Size (μm) | D10/D90 (μm) | Tap Density (g/cc) | Surface Area (m$^2$/g) | Surface Coating |
|---|---|---|---|---|---|
| PTX60 | 55-65 | 20/90 | 0.4 | 5.5 | None |
| PTX25 | 25-30 | 10/40 | 0.3 | 7 | None |
| PTX60S | 55-65 | 20/90 | 0.4 | 5.5 | S-Coating |
| PTX25S | 25-30 | 10/40 | 0.3 | 7 | S-Coating |

Example 2

In this example, BN reactive surface level is increased via an oxidation route of calcination. PTX60 spherical BN is placed in a ceramic crucible and then placed in a Lindberg/blue oven (model # BF51828C-1). The oven is set to ramp from 25° C. to 850° C. in 2 h, then stay at 850° C. for 8.5 h, and finally ramp down to 25° C. over 2.5 h. The resulting powder looks unchanged, but upon testing, showed an increase in surface oxygen content from <0.5% to almost 3%. The sample is used for subsequent surface functionalization step with a variety of organic reagents, and labeled as "Sph BN-OH".

Example 3

In this example, BN reactive surface level is increased with the use of an inorganic compound as a coating layer. Spherical BN (PTX60) is blended using a V-blender for about 15 to 60 minutes with Ken-React® KZ TPP® zirconate, forming zirconate coated BN (PTX60Z); Ken-React® KR-41B titanate, forming titanate coated BN (PTX60Ti). Spherical BN is wet-blended with aluminum acetate and subsequently dried forming alumina-coated BN (Sph BN-AlOx). The samples are subsequently used in the surface functionalization step as described below.

Figure 1B:
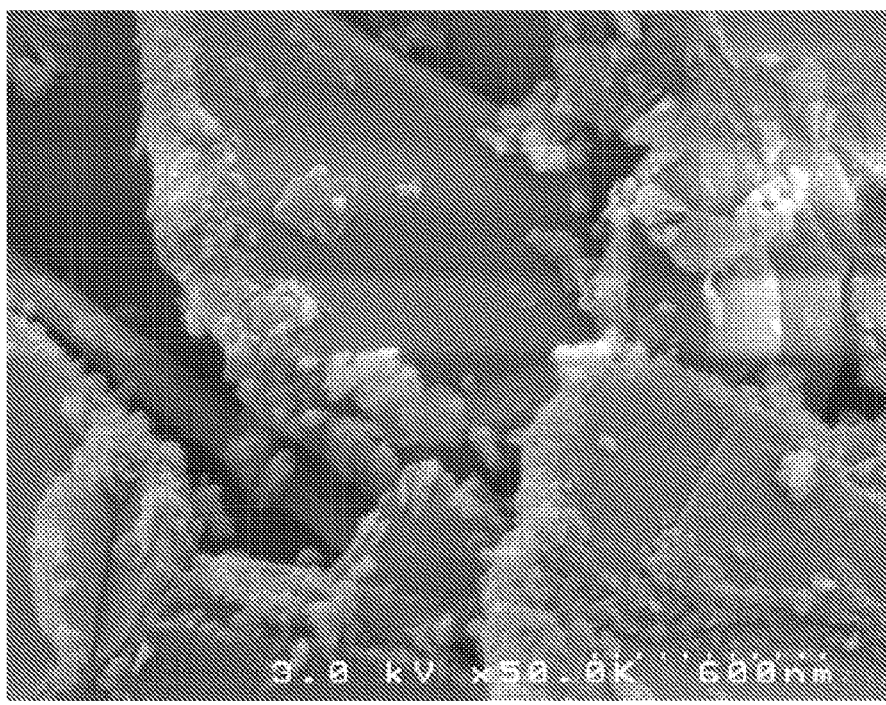

FIGS. 1A and 1B are SEM showing images of n-AlOx coated sph BN, with the n-AlOx particles being only on the edges of the BN platelets, covering less than 10% the surface.

Example 4

BN samples from Examples 2 and 3 are surface-functionalized with different reagents in a 4:3 methoxypropanol:DI water solution at 120° C. for the specified about of time indicated in Table 3 below.

| Entry # | sph BN type | Reagent | sph BN product name | reaction time |
|---|---|---|---|---|
| 1 | sphBN—AlOx | (MeO)3SiPh | sphBN—AlOx-SiPh | 48 h |
| 2 | sphBN—AlOx | undecyloxybenzoic acid | sphBN—AlOx-undecyl | 14 h |
| 3 | sphBN—AlOx | 3-glycidoxypropyl trimethoxysilane | sphBN—AlOx-glymo | 18 h |
| 4 | sphBN—OH | (MeO)3SiPh | sphBN—OH—SiPh | 21.5 h |
| 5 | sphBN—OH | undecyloxybenzoic acid | sphBN—OH-undecyl | 5 d |
| 6 | sphBN—OH | 3-glycidoxypropyl trimethoxysilane | sphBN—OH-glymo | 5 d |
| 7 | sphBN—OH | (MeO)3SiPh | sphBN—OH—SiPh | 5 d |
| 8 | sphBN—AlOx | (MeO)3SiPh | sphBN—AlOx-SiPh | 5 d |
| 9 | sphBN—AlOx | undecyloxybenzoic acid | sphBN—AlOx-undecyl | 5 d |
| 10 | sphBN | (MeO)3SiPh | sphBN—SiPh | 6 d |
| 11 | sphBN | undecyloxybenzoic acid | sphBN-undecyl | 6 d |
| 12 | sphBN | 3-glycidoxypropyl trimethoxysilane | sphBN-glymo | 6 d |
| 13 | sphBN—OH | ultrasil-CA1 | sphBN—OH-ultrasil1 | 18 h |
| 14 | sphBN—OH | ultrasil-CA2 | sphBN—OH-ultrasil2 | 23 h |
| 15 | sphBN—OH | undecyloxybenzoic acid | sphBN—OH-undecyl | 68 h |
| 16 | sphBN—OH | 3-glycidoxypropyl trimethoxysilane | sphBN—OH-glymo | 18 h |
| 17 | sphBN—AlOx | ultrasil-CA1 | sphBN—AlOx-ultrasil1 | 18 h |
| 18 | sphBN—AlOx | ultrasil-CA2 | sphBN—AlOx-ultrasil2 | 20 h |
| 19 | PTX60 | hi temp (800 C.) bake | sphBN—OH | 8 h |
| 20 | sphBN—AlOx | (3,3,3-trifluoropropyl)trimethoxysilane | sphBN—AlOx-trifluoro | 7 d |
| 21 | sphBN—AlOx | N-(2-aminoethyl)-3-aminopropyl trimethoxysilane | sphBN—AlOx-SiNH$_2$ | 7 d |
| 22 | sphBN—OH | (3,3,3-trifluoropropyl)trimethoxysilane | sphBN—OH-trifluoro | 6 d |
| 23 | sphBN—OH | (aminopropylmethylsiloxane)-(dimethylsiloane) copolymer | sphBN—OH-aminopoly | 6 d |
| 24 | sphBN—OH | N-(2-aminoethyl)-3-aminopropyl trimethoxysilane | sphBN—OH—SiNH$_2$ | 6 d |

Example 5—Viscosity Measurements

The surface functionalized BN powder samples of Example 4 are mixed with either polydimethylsilicone (PDMS) or a cyclohexylepoxy (UVR6105) at room temperature, at a loading of 35 wt. %. The mixing is done using a FlackTek speed mixer for about 20 seconds at approximately 3500 rpm. Viscosity measurements of the filled greases are measured using a Rheometric Scientific (model RDA3), and results are as follows in Table 4 below:

| Entry # | sph BN product | reaction time | RT Viscosity (35 wt % in PDMS) | RT viscosity (UVR6105) |
|---|---|---|---|---|
| 1 | sphBN—AlOx-SiPh | 48 h | 4595.85 | |
| 2 | sphBN—AlOx-undecyl | 14 h | 8605.47 | |
| 3 | sphBN—AlOx-glymo | 18 h | 7100.3 | |
| 4 | sphBN—OH—SiPh | 21.5 h | 21465 | |
| 5 | sphBN—OH-undecyl | 5 d | 21148.5 | 79042.8 |
| 6 | sphBN—OH-glymo | 5 d | 40646.9 | 1.53E+05 |
| 7 | sphBN—OH—SiPh | 5 d | 21169.6 | 2.65E+05 |
| 8 | sphBN—AlOx-SiPh | 5 d | 3149.21 | 15001.2 |
| 9 | sphBN—AlOx-undecyl | 5 d | 4343.91 | 13893.3 |
| 10 | sphBN—SiPh | 6 d | 5991.83 | |
| 11 | sphBN-undecyl | 6 d | 12922.1 | |
| 12 | sphBN-glymo | 6 d | 29611.5 | |
| 13 | sphBN—OH-ultrasil1 | 18 h | 28376.6 | 1.24E+05 |
| 14 | sphBN—OH-ultrasil2 | 23 h | 22275.5 | 33021.9 |
| 15 | sphBN—OH-undecyl | 68 h | 32149.3 | 43358.8 |
| 16 | sphBN—OH-glymo | 18 h | 23079.3 | 23359.5 |
| 17 | sphBN—AlOx-ultrasil1 | 18 h | 14211.1 | 11514.6 |
| 18 | sphBN—AlOx-ultrasil2 | 20 h | 12798.8 | 11876.1 |
| 19 | sphBN—OH | 8 h | 12346.3 | |

Example 5—Viscosity Measurements

Spherical BN fillers PTX60 and PTX60S of Example 1 are formulated with a 1000 cP silicon fluid to form thermal greases a different filler loadings. As shown in FIG. 2, formulations with the surface modified PTX60S show lower viscosities than with unmodified PTX60 at similar loading levels.

Example 6

Tables 5-8 give the thermal performance characteristics as well as the bond line thickness or BLT (measured under a pressure of 0.20 Mpa) of ten different grease formulations that use spherical BN fillers of Example 1 at different loading levels. The in-situ thermal resistivity is determined by a software macro provided with the Microflash™ instrument. To measure the bulk thermal conductivity, a 2" disc is prepared from the example, and the bulk thermal conductivity is measured on a Holometrix TCA300 instrument. Alternatively, Netzsch's Microflash 300 can also be used to obtain the bulk thermal conductivity. The in-situ thermal resistance is determined by dividing the bondline thickness by the in-situ thermal conductivity.

TABLE 5

| Formulation | Filler | Loading (wt %) | BLT (µm) | Thermal Conductivity (W/mK) | Resistance (mm$^2$K/W) |
|---|---|---|---|---|---|
| A-1 | PTX60 | 10.0 | 22.8 | 1.64 | 13.83 |
| A-2 | PTX60 | 15.0 | 29.0 | 2.44 | 11.88 |
| A-3 | PTX60 | 20.0 | 32.4 | 3.74 | 8.67 |
| A-4 | PTX60 | 25.0 | 31.4 | 3.99 | 7.87 |
| A-5 | PTX60 | 30.0 | 50.2 | 5.26 | 9.78 |
| A-6 | PTX60 | 35.0 | 52.6 | 5.39 | 9.82 |
| A-7 | PTX60 | 45.0 | 56.4 | 5.12 | 11.17 |
| A-8 | PTX60 | 50.0 | 52.0 | 3.66 | 14.35 |
| A-9 | PTX60 | 54.2 | 49.2 | 3.60 | 13.78 |
| A-10 | PTX60 | 57.2 | 116.2 | 4.69 | 25.20 |

TABLE 6

| Formulation | Filler | Loading (wt %) | BLT (μm) | Thermal Conductivity (W/mK) | Resistance (mm²K/W) |
|---|---|---|---|---|---|
| C-1 | PTX60S | 10.0 | 19.8 | 2.07 | 9.58 |
| C-2 | PTX60S | 15.0 | 27.0 | 2.93 | 9.55 |
| C-3 | PTX60S | 20.0 | 31.6 | 3.05 | 10.50 |
| C-4 | PTX60S | 25.0 | 52.6 | 4.27 | 12.38 |
| C-5 | PTX60S | 30.0 | 51.0 | 3.98 | 12.94 |
| C-6 | PTX60S | 35.0 | 56.2 | 3.97 | 14.17 |
| C-7 | PTX60S | 40.0 | 65.6 | 4.56 | 14.38 |
| C-8 | PTX60S | 45.0 | 73.4 | 4.40 | 16.65 |
| C-9 | PTX60S | 50.0 | 152.0 | 6.19 | 24.62 |
| C-10 | PTX60S | 54.2 | 451.6 | 8.32 | 54.07 |

TABLE 7

| Formulation | Filler | Loading (wt %) | BLT (μm) | Thermal Conductivity (W/mK) | Resistance (mm²K/W) |
|---|---|---|---|---|---|
| B-1 | PTX25 | 10.0 | 3.6 | 0.35 | 9.92 |
| B-2 | PTX25 | 15.0 | 17.2 | 2.43 | 7.21 |
| B-3 | PTX25 | 20.0 | 9.0 | 1.28 | 7.06 |
| B-4 | PTX25 | 25.0 | 14.0 | 2.33 | 5.98 |
| B-5 | PTX25 | 30.0 | 27.0 | 4.34 | 6.27 |
| B-6 | PTX25 | 35.0 | 26.2 | 3.65 | 7.26 |
| B-7 | PTX25 | 40.0 | 35.4 | 4.31 | 8.21 |
| B-8 | PTX25 | 45.0 | 32.4 | 3.62 | 8.96 |
| B-9 | PTX25 | 50.0 | 33.8 | 3.63 | 9.31 |
| B-10 | PTX25 | 52.0 | 60.0 | 4.62 | 13.13 |

TABLE 8

| Formulation | Filler | Loading (wt %) | BLT (μm) | Thermal Conductivity (W/mK) | Resistance (mm² K/W) |
|---|---|---|---|---|---|
| D-1 | PTX25S | 10.0 | 9.2 | 0.64 | 14.12 |
| D-2 | PTX25S | 15.0 | 14.2 | 1.22 | 11.74 |
| D-3 | PTX25S | 20.0 | 18.4 | 1.77 | 10.39 |
| D-4 | PTX25S | 25.0 | 25.2 | 2.66 | 9.52 |
| D-5 | PTX25S | 30.0 | 28.3 | 2.71 | 10.47 |
| D-6 | PTX25S | 35.0 | 32.2 | 2.85 | 11.39 |
| D-7 | PTX25S | 40.0 | 32.2 | 2.66 | 12.10 |
| D-8 | PTX25S | 45.0 | 34.4 | 2.65 | 12.99 |
| D-9 | PTX25S | 50.0 | 41.8 | 2.73 | 15.27 |
| D-10 | PTX25S | 54.2 | 145.2 | 3.69 | 39.82 |

Figure 3A:
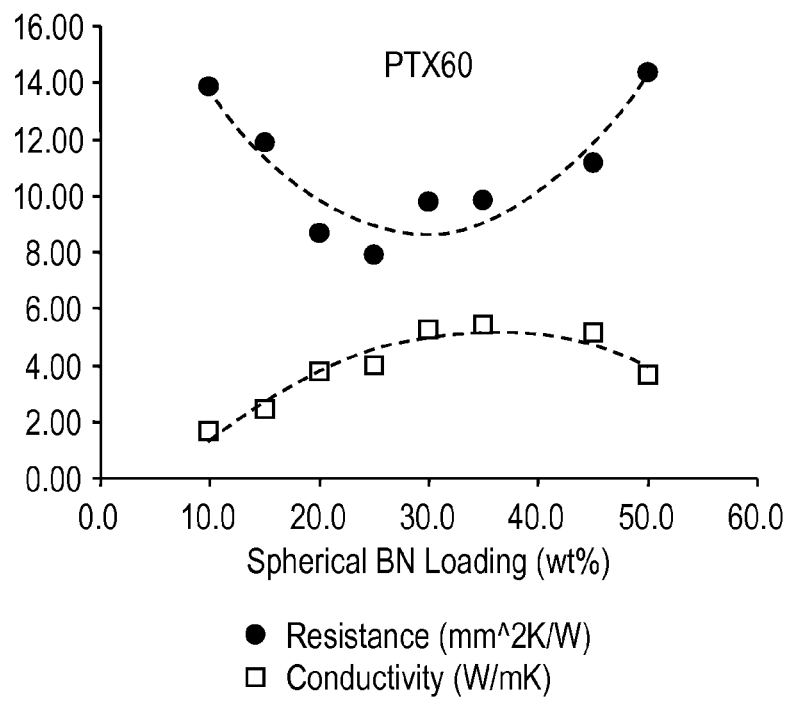
FIGS. 3A and 3B are graphs comparing the thermal performance results for one embodiment of a thermal grease filled with an embodiment of surface-functionalized BN vs. a thermal grease filled with the uncoated BN of the prior art. The BN powder has an average particle size of 55-65 μm.
Figure 3B:
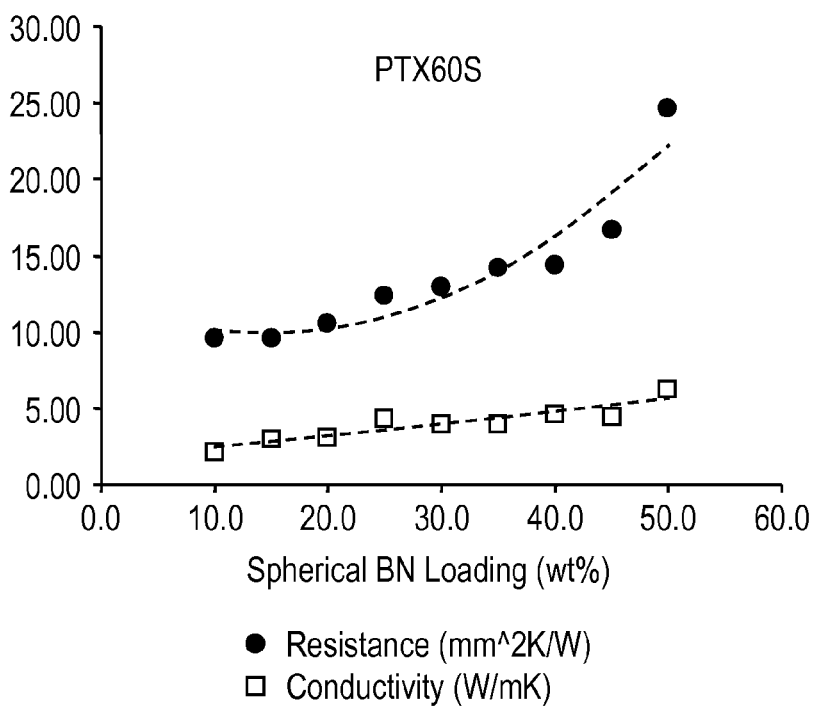
Figure 4A:
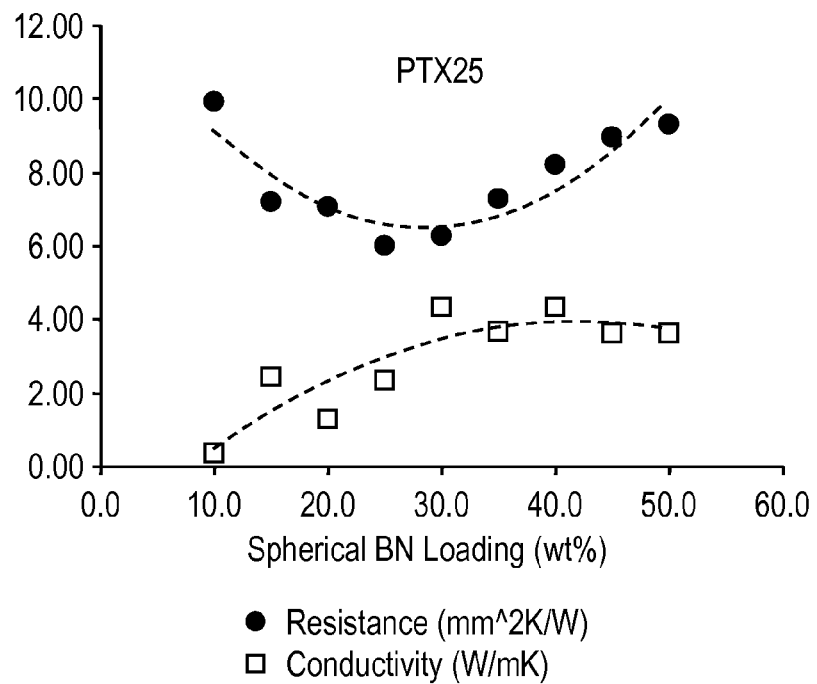
FIGS. 4A and 4B are graphs comparing the thermal performance results for one embodiment of a thermal grease filled with an embodiment of surface-functionalized BN vs. a thermal grease filled with the uncoated BN of the prior art. The BN powder has an average particle size of 25-30 μm.
Figure 4B:
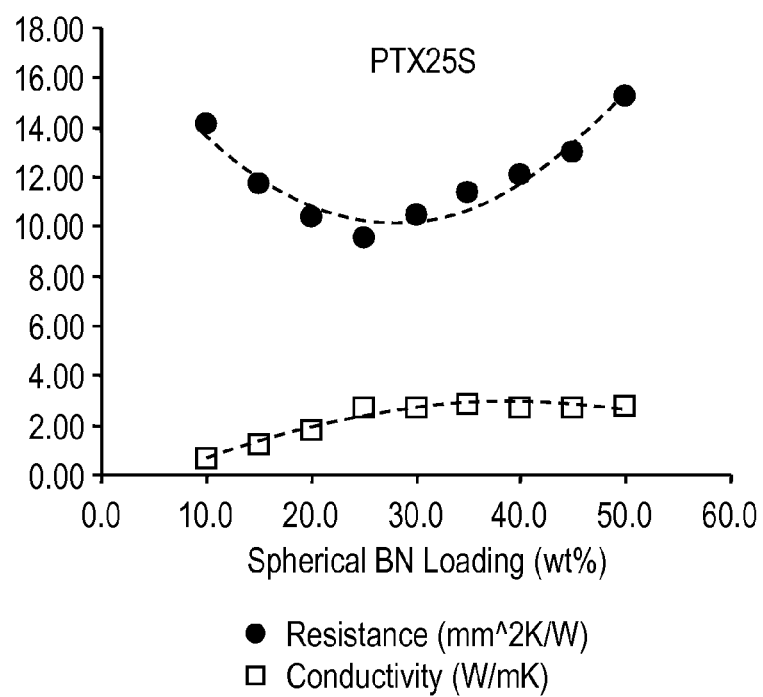

FIG. 3A and 3B compare the in-situ thermal resistance and the in-situ thermal conductivity versus the filler loading for the uncoated PTX60 filled greases and the surface-functionalized PTX60S filled greases of the invention. FIG. 4A and 4B compare the in-situ thermal resistance and the in-situ thermal conductivity of the smaller particle sized uncoated BN vs. coated BN. In the figures, PTX60, PTX25, and PTX25S show the lowest thermal resistance and highest thermal conductivity when filled at the 30-40 wt % loading level. At loadings of spherical BN filler greater than 45 wt %, the in-situ thermal conductivity tends to decrease and the in-situ thermal resistance tends to increase. This is due to the increase in BLT as well as an increase in the interfacial thermal resistance, wherein the high viscosities of the highly filled formulations do not provide as intimate a contact with the interfacing surfaces as compared to the lower viscosity, more flowable greases.

Figure 5:
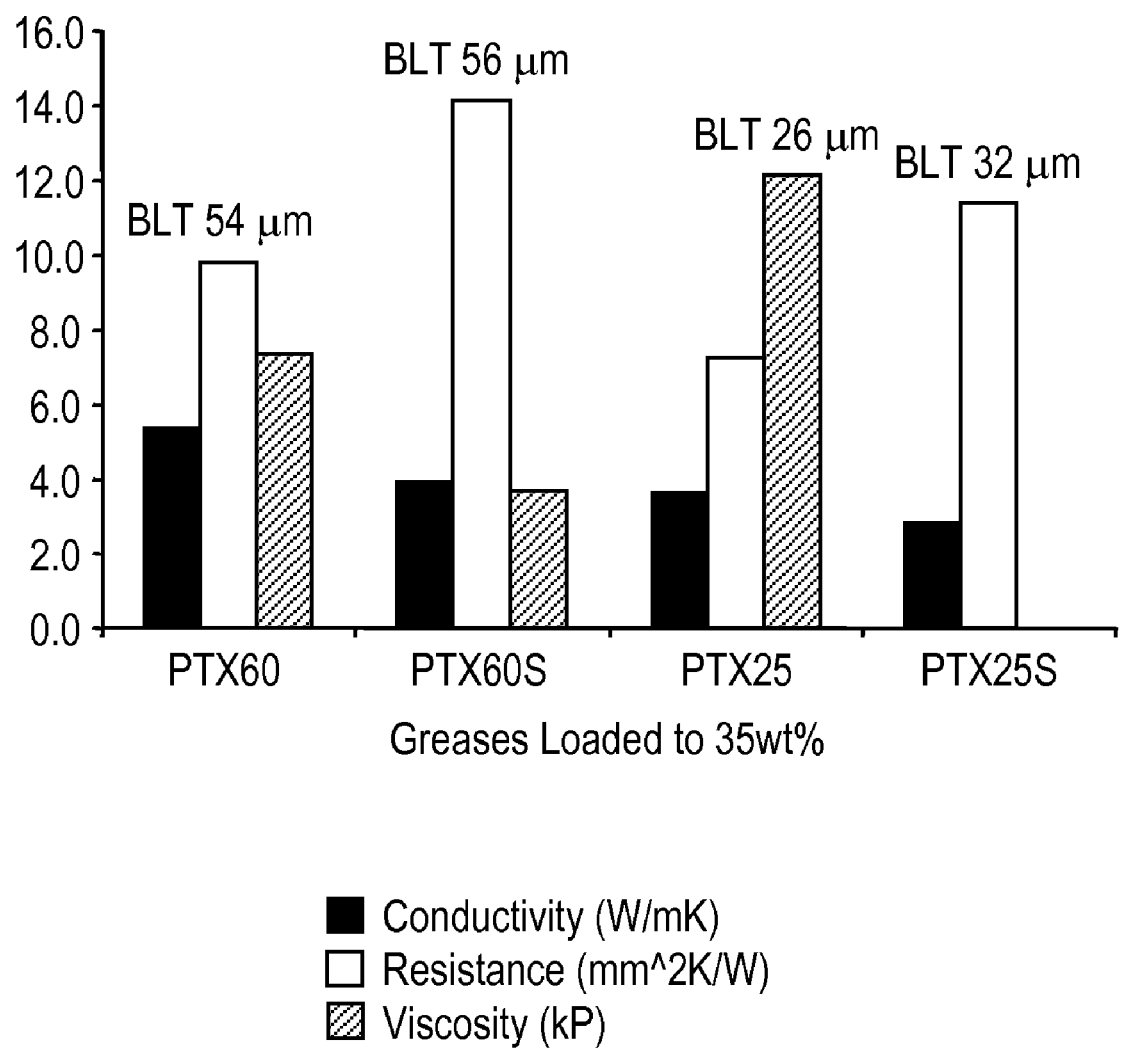
FIG. 5 is a graph illustrating the in-situ thermal conductivity and resistance, BLT, and viscosity of grease formulations with 35 wt % of uncoated spherical BN fillers of the prior art vs. embodiments of the surface-functionalized BN of the invention.

FIG. 5 shows the in-situ thermal conductivity and resistance, BLT, and viscosity of grease formulations with 35 wt % of the different spherical BN fillers of Example 1. The PTX25 and PTX25S formulations show lower BLTs than the PTX60 and PTX60S formulations. The S-coated PTX60S filler showed lower viscosity than the uncoated PTX60 filler (3700 kP vs. 7400 kP). The S-coated fillers show slightly lower thermal performance than the uncoated spherical BN fillers. However, minor optimization of the silicone resin and/or the surface coating on the spherical BN fillers, can enable reduced viscosity without negatively affecting thermal performance.

Example 6

Tables 7 and 8 summarize thermal performance characteristics, resistance, and bond line thickness or BLT (measured under a pressure of 0.20 Mpa) of different grease formulations that use spherical BN fillers of Example 1 at different loading levels.

| sample # | Entry # | sph BN type | wt % BN | BLT (mils) | TC (W/mK) | TR (mm^2 K/W) |
|---|---|---|---|---|---|---|
| PTX60Z-1.4 | 31a | sphBN | 30 | 1.44 | 3.45 | 10.71 |
| | 31b | | 35 | 1.77 | 4.30 | 10.54 |
| | 31c | | 40 | 1.94 | 4.79 | 10.42 |
| | 31d | | 45 | 2.32 | 5.35 | 11.21 |
| | 31e | | 50 | 3.78 | 6.26 | 15.41 |
| PTX60Z-2.5 | 32a | sphBN | 30 | 1.34 | 3.56 | 9.70 |
| | 32b | | 35 | 1.57 | 4.35 | 9.32 |
| | 32c | | 40 | 1.82 | 4.57 | 10.43 |
| | 32d | | 45 | 2.04 | 4.52 | 11.79 |
| | 32e | | 50 | 2.39 | 5.17 | 11.79 |
| PTX60Z-4 | 33a | sphBN | 30 | 1.57 | 3.93 | 10.25 |
| | 33b | | 40 | 1.91 | 4.96 | 9.76 |
| | 33c | | 45 | 2.14 | 5.51 | 9.88 |
| | 33d | | 50 | 2.58 | 4.99 | 13.24 |
| PTX60Z-7 | 34a | sphBN | 30 | 1.53 | 3.92 | 9.94 |
| | 34b | | 40 | 1.96 | 5.09 | 9.82 |
| | 34c | | 45 | 2.25 | 5.28 | 10.85 |
| | 34d | | 50 | 2.74 | 6.07 | 11.53 |
| PTX60Ti-1.5 | 35a | sphBN | 30 | 1.43 | 3.11 | 11.68 |
| | 35b | | 35 | 1.64 | 4.02 | 10.38 |
| | 35c | | 40 | 1.89 | 4.54 | 10.61 |
| | 35d | | 45 | 1.77 | 4.54 | 9.91 |
| | 35e | | 50 | 2.47 | 4.73 | 13.46 |
| PTX60 (A-8) | 40a | sphBN | 30 | 1.32 | 3.99 | 8.46 |
| | 40b | | 35 | 1.53 | 3.29 | 12.15 |
| | 40c | | 40 | 1.67 | 4.18 | 10.60 |
| | 40d | | 45 | 1.88 | 5.66 | 8.52 |
| | 40e | | 50 | 2.37 | 5.50 | 11.09 |

TABLE 7

| sample # | sph BN product | wt % BN | avg BLT | avg TC | avg TR |
|---|---|---|---|---|---|
| C1069-72-2 | sphBN-glymo | 35 | 0.44 | 1.33 | 8.42 |
| C1069-71-1 | sphBN—SiPh | 35 | 1.50 | 3.34 | 11.57 |
| C1069-72-1 | sphBN-undecyl | 35 | 1.20 | 2.89 | 10.68 |
| C1069-70-2 | sphBN—AlOx-SiPh | 35 | 2.11 | 4.90 | 11.08 |
| C1069-70-3 | sphBN—AlOx-undecyl | 35 | 2.30 | 5.00 | 11.87 |
| C1069-70-1 | sphBN—OH—SiPh | 35 | 0.73 | 1.95 | 9.58 |
| GEQ SD14 | sphBN—AlOx-1.6 | 35 | 3.11 | 5.97 | 13.33 |
| GEQ SD3 | sphBN—AlOx-3.5 | 35 | 3.67 | 6.79 | 13.82 |
| GEQ SD15 | sphBN—AlOx-8.2 | 35 | 3.21 | 6.53 | 12.64 |

This written description uses examples to disclose the invention, including the best mode, and also to enable any person skilled in the art to make and use the invention. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

All citations referred herein are expressly incorporated herein by reference.

The invention claimed is:

1. A boron nitride composition comprising boron nitride powder, the boron nitride powder having its surface treated with at least an over-coating layer comprising at least one of a silane, a siloxane, a carboxylic derivative, and mixtures thereof, the over-coating layer having at least a reactive one functional group, wherein the over-coating layer adheres to at least 2% of the surface of the boron nitride, wherein the boron nitride powder prior to being treated with the over-coating layer, is first calcined and/or treated to form a plurality of reactive sites on its surface containing at least a functional group that is reactive to at least one functional group of the over-coating layer.

2. The boron nitride composition of claim 1, wherein the boron nitride powder is first calcined at a temperature between 200 and 1000°C for 0.5 to 24 hours in an oxidizing environment.

3. The boron nitride composition of claim 2, wherein the boron nitride powder is first calcined at a sufficient temperature for a sufficient amount of time for the boron nitride powder to have an oxygen concentration of at least 2%.

4. The boron nitride composition of claim 1, wherein the boron nitride powder is first treated by coating the boron nitride powder with at least one inorganic or organometallic compound for the surface to have a plurality of reactive sites containing at least a functional group that is reactive to at least one functional group of the final coating layer.

5. The boron nitride composition of claim 4, wherein the boron nitride powder is first treated by coating the boron nitride powder with an inorganic compound.

6. The boron nitride composition of claim 5, wherein the boron nitride powder is first treated by coating the boron nitride powder with at least one of a refractory metal oxide and hydroxide.

7. The boron nitride composition of claim 4, wherein boron nitride powder is first treated by coating the boron nitride powder with 0.5 to about 10 wt. % of an inorganic compound selected from the group of refractory metal oxides and hydroxides.

8. The boron nitride composition of claim 4, wherein the boron nitride powder is first treated by coating the boron nitride powder with at least an organometallic compound.

9. The boron nitride composition of claim 4, wherein the boron nitride powder is first treated by coating the boron nitride powder with at least an organometallic compound or a metallic compound, and heated to a sufficient temperature for the organometallic or the metallic compound to be converted to at least one of alumina, silica, zirconia, boria, titania, ceria, germania, tantalum oxide, cesia, yttria, magnesia, thoria, and mixtures thereof.

10. The boron nitride composition of claim 4, wherein the boron nitride powder is first treated by coating the boron nitride powder with at least one of: nickel acetate, nickel sulfate, nickel nitrate, copper acetate, copper sulfate, copper nitrate, zinc acetate, zinc is sulfate, zinc nitrate, strontium acetate, strontium sulfate, strontium nitrate, aluminum sulfate, aluminum propoxide, aluminum silicate, sodium aluminate, aluminum acetate and mixtures thereof.

11. The boron nitride composition of claim 4, wherein the boron nitride powder is first treated by coating the boron nitride powder with a composition comprising colloidal silica having an average particle size ranging from 20 to 100 nm.

12. The boron nitride composition of claim 4, wherein the boron nitride powder is first treated by coating the boron nitride powder with a composition comprising at least one of sorbitan monostearate, sorbitan monolaurate, sorbitan monoleate, sorbitan monopalmate, polyoxyethylene sorbitan monolaurate, polyoxyethylene sorbitan monostearate, polyoxyethylene sorbitan monooleate, polyoxyethylene sorbitan monopalmate, and polyoxyethylene sorbitan tristearate, and mixtures thereof.

13. The boron nitride composition of claim 1, wherein the over coating layer comprises one of a polyparahydroxy benzoic acid and undecyloxybenzoic acid.

14. The boron nitride composition of claim 1, wherein the over coating layer comprises a compound selected from the group of functionalized silanes, disilanes, trisilanes, oligomeric silanes, polymeric silanes, and combinations thereof.

15. The boron nitride composition of claim 14, wherein the functionalized silane comprises at least one functional group selected from amine, carboxylic acid, anhydride, phosphonic acid, pyridinyl, hydroxyl, epoxy, thioisocyanate, blocked polythioisocyanate, amide, carbamate, maleimide, fumarate, onium salt, hydroxy alkylamide, half-ester acid group and salts, and combinations thereof.

16. The boron nitride composition of claim 1, wherein the boron nitride powder comprises platelets having an average particle size of at least 50 pm.

17. The boron nitride composition of claim 1, wherein the boron nitride powder comprises platelets having an average particle size of ranging from 10 to 300 pm.

18. The boron nitride composition of claim 17, wherein the boron nitride powder comprises platelets having an average particle size of ranging from 10 to 100 pm.

19. The boron nitride composition of claim 1, wherein the boron nitride powder comprises spherically shaped agglomerates of irregular non-spherical particles bound together by a binder and subsequently spray-dried.

20. The boron nitride composition of claim 1, wherein the boron nitride powder comprises hexagonal boron nitride platelets having an aspect ratio of from about 50 to about 300.

21. The boron nitride composition of claim 20, wherein the boron nitride powder comprises hexagonal boron nitride platelets having an aspect ratio of from about 50 to about 100.

22. The boron nitride composition of claim 1, wherein the boron nitride powder comprises irregularly shaped agglomerates of hexagonal boron nitride platelets, having an average particle size of above 10 microns.

23. An article comprising the boron nitride composition of claim 1.

24. A polymer composite comprising a polymer matrix selected from the group of a melt-processable polymers, polyesters, phenolics, silicone polymers, acrylics, waxes, thermoplastic polymers, low molecular weight fluids, and epoxy molding compounds, and mixtures thereof, and a filler material comprising particles of boron nitride, the boron nitride having its surface treated with at least an coating compound comprising at least one of a silane, a siloxane, a carboxylic derivative, and mixtures thereof, and wherein the coating compound adheres to at least 10% of the surface of the boron nitride.

25. The polymer composite of claim 24, wherein the polymer matrix comprises a silicone resin.

26. The polymer composite of claim 24, wherein the polymer matrix comprises at least one of a liquid crystal polymer; a polyester such as polyethylene naphthalate, polyethylene terephthalate, polybutylene terephthalate; a polyamide; a polyimide; a polyphthalamide; a polyphenylene sulfide; a polycarbonate; a polyetheretherketone; apolyaryletherketone; a polyphenylene oxide; and a mixture thereof.

27. A method for producing boron nitride powder, comprising the steps of: introducing a plurality of reactive sites on at least a portion of the boron nitride surface; coating the boron nitride with at a coating layer comprising a compound selected from at least one of a silane, a siloxane, a carboxylic derivative, and mixtures thereof, the coating compound contains has at least a reactive functional group; wherein the coating layer adheres to at least 10% of the surface of the boron nitride surface.

28. The method of claim 27, wherein the reactive sites are introduced on at least a portion of the boron nitride surface by: calcining the boron nitride at a temperature between 200 and 10000 C for 0.5 to 24 hours in an oxidizing environment.

29. The method of claim 27, wherein the reactive sites are introduced on at least a portion of the boron nitride surface by: calcining the boron nitride at a sufficient temperature for a sufficient amount of time for the boron nitride powder to have an oxygen concentration of at least 2%.

30. The method of claim 27, wherein the reactive sites are introduced on at least a portion of the boron nitride surface by: coating the boron nitride powder with at least an inorganic compound or a metallic compound, and heating the coated boron powder to a sufficient temperature for the organometallic or the metallic compound to be converted to at least one of alumina, silica, zirconia, boria, titania, ceria, germania, tantalum oxide, cesia, yttria, magnesia, thoria, and mixtures thereof.

* * * * *